United States Patent
Takahashi

(10) Patent No.: US 7,094,459 B2
(45) Date of Patent: Aug. 22, 2006

(54) METHOD FOR COOLING ELECTRONIC COMPONENTS AND THERMALLY CONDUCTIVE SHEET FOR USE THEREWITH

(75) Inventor: Kouya Takahashi, Tokyo (JP)

(73) Assignee: Polymatech Co., Ltd., Tokyo (JP)

( * ) Notice: Subject to any disclaimer, the term of this patent is extended or adjusted under 35 U.S.C. 154(b) by 78 days.

(21) Appl. No.: 10/328,431

(22) Filed: Dec. 23, 2002

(65) Prior Publication Data

US 2003/0129352 A1    Jul. 10, 2003

(30) Foreign Application Priority Data

Dec. 27, 2001    (JP)    ............. 2001-397353

(51) Int. Cl.
*B32B 1/04*    (2006.01)
(52) U.S. Cl. .............. 428/68; 428/447; 361/688; 361/706
(58) Field of Classification Search ............. 428/68, 428/447; 361/688, 706
See application file for complete search history.

(56) References Cited

U.S. PATENT DOCUMENTS

| | | | |
|---|---|---|---|
| 6,046,907 A | * | 4/2000 | Yamaguchi .............. 361/704 |
| 6,081,428 A | * | 6/2000 | Fujimoto .................. 361/719 |

FOREIGN PATENT DOCUMENTS

| | | |
|---|---|---|
| DE | 92 13 849 | 1/1993 |
| DE | 197 04549 | 8/1997 |
| EP | 0 453 764 | 10/1991 |
| JP | 2000-001616 | 1/2000 |
| JP | 2000-345040 | 12/2000 |

OTHER PUBLICATIONS

"Heat Transfer Device for Electronic Modules" Research Disclosure, Kenneth Mason Publications, Hampshire, GB, No. 330, Oct. 1, 1991, p. 770.

* cited by examiner

*Primary Examiner*—Patrick Joseph Ryan
*Assistant Examiner*—Jane Rhee
(74) *Attorney, Agent, or Firm*—Fish & Richardson P.C.

(57) ABSTRACT

A thermally conductive sheet includes a thermally conductive layer and an insulation layer laminated onto the thermally conductive layer. The thermally conductive layer includes matrix containing thermally conductive filler having an electrical conductivity. The insulation layer contains thermally conductive filler having an insulating property. The thermally conductive sheet is disposed so that the insulation layer covers the terminal of the electronic component and the electric circuit. At this time, the thermally conductive layer covers and closely contacts with the insulation layer and the electronic component. The heat generated by the electronic component is conducted to a cooling member through the thermally conductive layer and is ultimately dissipated.

20 Claims, 2 Drawing Sheets

METHOD FOR COOLING ELECTRONIC COMPONENTS AND THERMALLY CONDUCTIVE SHEET FOR USE THEREWITH

CROSS REFERENCE TO RELATED APPLICATIONS

Pursuant to 35 USC § 119, this application claims the benefit of Japan Patent Application No. 2001-397353 filed Dec. 27, 2001.

BACKGROUND OF THE INVENTION

The present invention relates to a method for cooling electronic components used within information instruments, imaging instruments, mobile telecommunication instruments, and other electronic instruments. More particularly, the present invention relates to a method for cooling electronic components by conducting the heat to a cooling member, such as a radiator and a thermally conductive metal plate, and a thermally conductive sheet for use with such a method.

As the performance of electronic components, such as CPUs, integrated in electronic instruments improves, the amounts of electric power consumption and heat generation have increased significantly. Consequently, cooling these electronic components has become an urgent problem that must be addressed in order to maintain the performances of the electronic components. For this reason, a demand exists for thermally conductive sheets having a high heat conductivity that are placed between an electronic component and a cooling member to conduct heat generated by the electronic component to the cooling member.

To meet such a demand, Japanese Laid-Open Patent Publication No. 2000-001616 discloses a method for densely filling a thermally conductive sheet with thermally conductive filler. Also, Japanese Laid-Open Patent Publication No. 2000-345040 describes a method in which a stick-shaped thermally conductive filler is oriented in a particular direction to increase the heat-conductivity in that direction to achieve an even high heat-conductivity.

In addition to high thermal conductivity, a thermally conductive sheet is required to have a high electrical resistance to serve as a good electrical insulator. For instance, when several electronic components are mounted adjacent to one another, a single thermally conductive sheet sufficiently large to cover all of the components is often used rather than using separate thermally conductive sheets, each having the substantially same size as the component, one for each component. When used in this fashion, the thermally conductive sheet comes into contact not only with the intended electronic components but also with other electrically conductive components, such as connection terminals and electronic circuits. For this reason, the thermally conductive sheets must have a high electrical resistance. Specifically, such a thermally conductive sheet must have an electrical resistance of $1.0 \times 10^{10}$ Ω·cm or higher. To this end, conventional thermally conductive sheets included thermally conductive fillers having a high electrical resistance, such as alumina and magnesia.

However, recently developed high-performance electronic components generate significant amounts of heat. The conventional thermally conductive sheets that contain thermally conductive fillers having a high electrical resistance, such as alumina and magnesia, fail to provide a sufficiently high heat conductivity, in particular a heat conductivity of 6 W/m·K or more, to effectively conduct the heat generated by the high-performance electronic components to a cooling member.

A different type of conventional thermally conductive sheet contains thermally conductive filler of graphitized carbon powder and/or metal powder, each of which is a highly thermally conductive material. The thermally conductive sheet thus achieves a high heat conductivity of 6 W/m·K or higher. This type of thermally conductive sheet, however, has a low electrical resistance and may allow an undesirable electrical conduction near terminals and electronic circuits of the electronic components. As a result, such a thermally conductive sheet has a limited range of applications.

The high performance electronic components are densely integrated in newly developed electronic instruments and, therefore, a novel approach is demanded for effectively cooling these electronic components, such as a thermally conductive sheet that has a high heat conductivity of 6 W/m·K or higher as well as a high electric resistance of $1.0 \times 10^{10}$ Ω·cm or higher.

BRIEF SUMMARY OF THE INVENTION

The present invention has been devised to address the aforementioned drawbacks of the current state of the art.

To that end, it is an objective of the present invention to provide a method for cooling electronic components, by which the generated heat is efficiently conducted to a cooling member while terminals of the electronic components and electric circuits around them remain electrically insulated. It is also an objective of the present invention to provide a thermally conductive sheet for use with the electronic components.

One aspect of the present invention provides a thermally conductive sheet for cooling an electronic component having a terminal and being mounted on a substrate with an electric circuit. The thermally conductive sheet comprises a thermally conductive layer (including matrix and thermally conductive filler contained in the matrix) and an insulation layer selectively disposed over part of the thermally conductive layer, for contacting the terminal of the electronic component and the electric circuit of the substrate when the thermally conductive sheet is disposed on the substrate and the electronic component.

Another aspect of the present invention provides a device for cooling an electronic component integrated in an electronic instrument, the electronic component having a terminal and being mounted on a substrate with an electric circuit. The device comprises a thermally conductive sheet, which includes a thermally conductive layer having a matrix and thermally conductive filler contained in the matrix; and which includes an insulation layer selectively disposed over part of the thermally conductive layer. The thermally conductive sheet is disposed over the substrate and the electronic component so that the insulation layer closely contacts with the terminal of the electronic component and the electric circuit of the substrate, and so that the thermally conductive layer closely contacts with the electronic component. The device further comprises a cooling member arranged on the thermally conductive layer to allow the heat generated by the electronic component to be conducted to the cooling member through the thermally conductive layer.

A still another aspect of the present invention provides a method for producing a thermally conductive sheet for cooling an electronic component having a terminal and being mounted on a substrate with an electric circuit. The method includes the steps of forming a thermally conductive layer including matrix and thermally conductive filler contained in the matrix; and selectively disposing an insulation layer over part of the thermally conductive layer so that the insulation layer contacts with both the terminal of the electronic component and the electric circuit of the substrate.

A still another aspect of the present invention provides a method for cooling an electronic component integrated in an electronic instrument. The electronic component has a terminal disposed on a substrate with an electric circuit. In the electronic component, an insulation layer is disposed selectively on the terminal and the electric circuit on the substrate to cover the terminal and the electric circuit; and a thermally conductive layer is disposed over the insulation layer and the electronic component so that the thermally conductive layer closely contacts with both the insulation layer and the electronic component. The thermally conductive layer includes a matrix and thermally conductive filler contained in the matrix. A cooling element is arranged on the thermally conductive layer. The method comprises a step of conducting the heat generated by the electronic component to the cooling member through the thermally conductive layer to cool the electronic component.

Other aspects and advantages of the invention will become apparent from the following description, taken in conjunction with the accompanying drawings, illustrating by way of example the principles of the invention.

BRIEF DESCRIPTION OF THE SEVERAL VIEWS OF THE DRAWINGS

The invention, together with objects and advantages thereof, may best be understood by reference to the following description of the presently preferred embodiments together with the accompanying drawings in which:

FIG. 4 is a bottom view showing a thermally conductive sheet of Comparative Example 1; and FIG. 5 is a cross-sectional view showing an electronic component according to Comparative Example 2.

DETAILED DESCRIPTION OF THE PREFERRED EMBODIMENTS

A thermally conductive sheet in one specific embodiment of the method of the present invention will now be described in detail with reference to the accompanying drawings.

Figure 1:
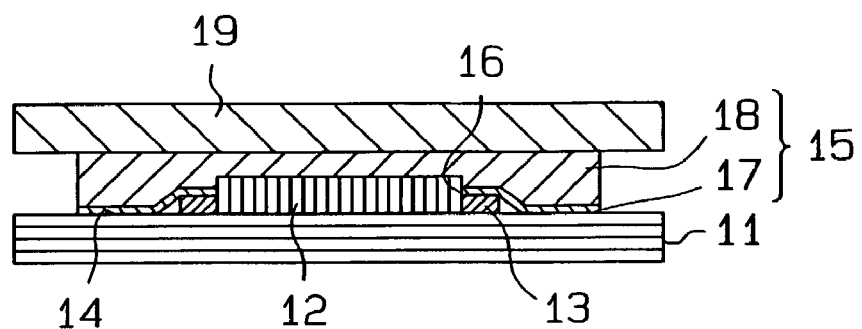
FIG. 1 is a cross-sectional view showing essential elements of a construction for cooling an electronic component in one embodiment of the present invention.
Figure 2A:
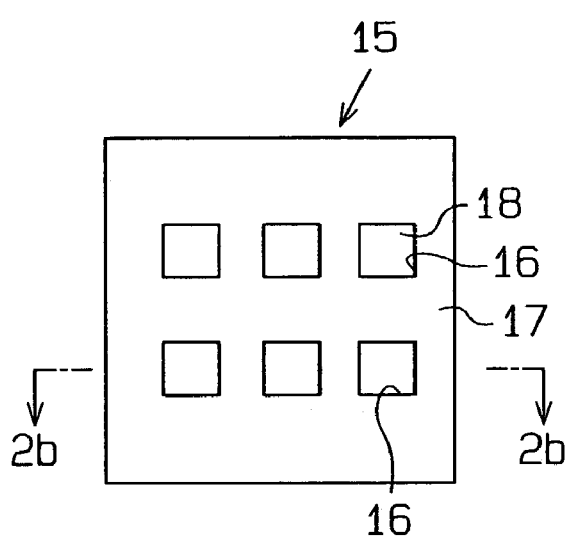
FIG. 2(a) is a bottom view showing a thermally conductive sheet of the present invention.
Figure 2B:
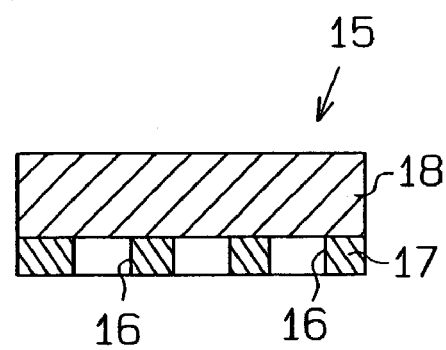
FIG. 2(b) is a cross-sectional view of the thermally conductive sheet, taken along the line 2b–2b in FIG. 2(a)

Referring to FIG. 1, an electronic component 12 and an electric circuit 14 are arranged on a substrate (electric circuit board) 11. The electric circuit 14 is connected to the electronic component 12 via a plurality of terminals 13 thereof. As shown in FIGS. 2(a) and 2(b), a thermally conductive sheet 15 comprises of a sheet-like thermally conductive layer 18 and an insulation layer 17 joined to the thermally conductive layer 18. The insulation layer 17 includes a plurality (in this example, 6) of windows 16 each sized and shaped to correspond to the electronic component 12.

The thermally conductive layer 18 is made from matrix containing thermally conductive filler. The thermally conductive layer 18 conducts heat emanated from the electronic component 12 to a cooling member 19, such as a heat sink or a thermally conductive metal plate. The thermally conductive filler may have not only high thermal conductivity but also an undesirable electrical conductivity. The matrix is suitably selected depending on required properties, such as mechanical strength, heat-resistance, and durability. Examples of the matrix include a gel, an elastomer, and a synthetic resin, which examples are not limited in their chemical composition and curing types. Among these examples, liquid silicone rubbers and liquid silicone gels are particularly preferred because of their good adhesion and conformity to the electronic component. A mixture of two or more different types of the matrix may also be used The thermally conductive filler contained in the matrix preferably comprises a carbon and/or a metal material in the form of a powder or fibers because of the filler's high heat conductivity. Examples of the carbon material include powder and fibers of graphitized carbon, carbon black, or graphite. Examples of the metal material include powder and fibers (in particular, short fibers) of gold, silver, copper, iron, zinc, nickel, aluminum, stainless steel, or composites thereof. These highly thermally conductive fillers may also have an electrical conductivity.

The thermally conductive filler may be silver-, gold-, or carbon-coated powder or fibers and may have any shape, size, or length as long as it comprises at least one selected from the aforementioned powders and fibers. If necessary, the thermally conductive filler may be surface-treated with a silane coupling agent or a titanate coupling agent.

In addition to the above-described thermally conductive filler, an additional thermally conductive filler having a high electrical resistance of about $1.0 \times 10^{10}$ $\Omega \cdot cm$ may be added to the thermally conductive layer. Examples of this additional thermally conductive filler include, but are not limited to, diamond, boron nitride, aluminum nitride, silicon carbide, alumina, zinc oxide, and other known thermally conductive fillers.

Preferably, the content of the thermally conductive filler in the matrix is 20 to 80% by volume (vol %). If the content of the thermally conductive filler is less than 20% by volume, the thermally conductive filler fails to provide the thermally conductive layer with sufficient heat conductivity. Conversely, if the content of the thermally conductive filler in the matrix exceeds 80% by volume, the sheet material including the matrix containing the thermally conductive filler becomes excessively viscous, resulting in a reduced workability during the sheet production.

The insulation layer 17, on the other hand, contains an electrically insulative thermally conductive filler and electrically insulates the terminals of the electronic components 12 and the electric circuits 14. The insulation layer 17 preferably contains thermally conductive filler having a high electrical resistance of about $1.0 \times 10^{10}$ $\Omega \cdot cm$. Examples of the material of the thermally conductive filler include, but are not limited to, diamond, boron nitride, aluminum nitride, silicon carbide, alumina, or zinc oxide.

The insulation layer 17 may be formed from materials such as insulative elastomer, insulative coating, and insulative film, and their type and composition are not limited. The insulation layer 17 preferably has an adherence enough to prevent any defect, such as peeling and chipping of the layer. The insulation layer 17 preferably has a high electrical resistance of $1.0 \times 10^{10}$ $\Omega \cdot cm$ or higher, more preferably $1.0 \times 10^{12}$ $\Omega \cdot cm$ or higher. The insulation layer 17 may contain thermally conductive filler that has a high electrical resistance.

The insulation layer 17 preferably has a thickness of 0.01 to 1.0 mm, more preferably 0.05 to 0.5 mm, and still more preferably 0.05 to 0.2 mm. The thickness of the insulation layer 17 less than 0.01 mm reduces workability in processes for forming the layer, including printing, coating, and transfer coating. The insulation layer 17 with such a small thickness tends to have a non-uniform thickness, which makes it difficult to ensure sufficient electrical resistance. On the other hand, if the thickness of the insulation layer 17 exceeds 1.0 mm, the layer may function as a spacer to form a space between the thermally conductive layer 18 and the electronic component 12. As a result, the contact area between the thermally conductive layer 18 and the electronic component 12 is decreased to reduce heat conduction there between. Thus, the heat conductive efficiency of the thermally conductive sheet 15 is decreased. The insulation layer 17 is arranged in such a manner that it prevents the terminals 13 of the electronic component 12 and the electric circuits 14 on the substrate 11 from contacting with the thermally conductive layer 18. The insulation layer 17 may be partially disposed between the electronic component 12 and the thermally conductive layer 18.

The thermally conductive sheet 15 is formed by laminating the insulation layer 17 onto the thermally conductive layer 18. The thermally conductive layer 18 and the insulation layer 17 of the thermally conductive sheet 15 may contain other additives, as required in addition to the above thermally conductive filler. Such additives include plasticizer, thickener, adhesive, reinforcing agent, color, and heat resistance-enhancing agent.

The thermally conductive sheet 15 preferably has a thickness of 0.1 to 5 mm. The thermally conductive sheet 15 with a thickness of less than 0.1 mm is difficult to produce and decreases the workability during the sheet production. In comparison, the thermally conductive sheet 15 with a thickness exceeding 5 mm has reduced heat conductivity and adds to the production cost.

The thermally conductive layer 18 and the insulation layer 17 of the thermally conductive sheet 15 are held in close contact with each other to prevent the layers from coming apart when the thermally conductive sheet is placed over the electronic component. The thermally conductive layer 18 and the insulation layer 17 are not necessarily integrated together, since the thermally conductive sheet 15 is often compressed and held in place between the cooling member 19 and the electronic component 12. However, if there is a risk of the insulation layer 17 coming off due to lack of adherence between the thermally conductive layer 18 and the insulation layer 17, an adhesive layer may be disposed between the two layers to adhere them to each other. The thermally conductive sheet 15 may has a sheet- or mesh-like or fibrous structure, which is stacked thereon or embedded therein for the purposes of improvement of the workability and reinforcement of the thermally conductive sheet 15.

The thermally conductive sheet 15 may be formed integrally by the following methods. A first method involves forming the thermally conductive layer 18, masking an area of the thermally conductive layer 18 that comes into contact with the electronic component 12, selectively depositing the insulation layer 17 on an area of the thermally conductive layer 18 that comes into contact with the terminal 13 of the electronic component 12 and the electric circuit 14, and removing the masking. Examples of techniques for forming the thermally conductive layer 18 include bar coater technique, doctor blade technique, extrusion molding using a T-shaped die, and calendering. Examples of techniques for depositing the insulation layer 17 include printing, coating, and transferring processes.

A second method involves placing the insulation layer 17 in the form of an insulative film over an area of the thermally conductive layer 18, including parts that come into contact with the terminals 13 and electric circuits 14 but excepting parts that come into contact with the electronic components 12. The insulation layer 17 is held in close contact with the thermally conductive layer 18.

A third method involves adhering the insulation layer 17 in the form of an insulative film to an area of the thermally conductive layer 18, including parts that come into contact with the terminals 13 and electric circuits 14 but excepting parts that come into contact with the electronic components 12.

Figure 3:
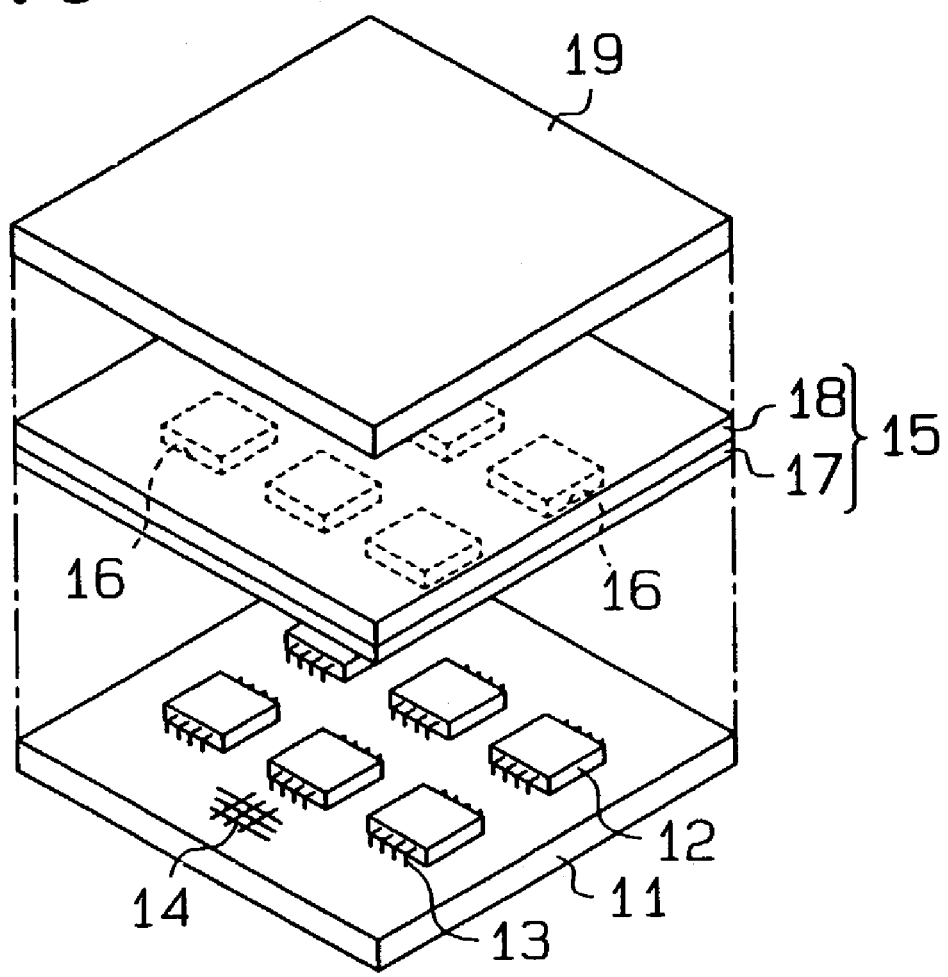
FIG. 3 is an exploded perspective view showing a construction for cooling the electronic component.

As shown in FIG. 3, a plurality of the electronic components 12 are mounted on the surface of the substrate 11, on which the thermally conductive sheet 15 is disposed with the insulation layer 17 facing the surface of the substrate 11. A heat sink serving as the cooling member 19 is placed on the thermally conductive sheet 15. In this manner, the electronic components 12 are received in the respective windows 16, and the insulation layer 17 covers the terminals 13 of each electronic component 12 as well as the electric circuits 14, with the thermally conductive layer 18 covering and closely contacting with each electronic component 12. The cooling member 19 is arranged on top of the thermally conductive layer 18 of the thermally conductive sheet 15.

In such a construction, the thermally conductive layer 18, which contains the highly thermally conductive filler and covers the electronic components 12, effectively conducts the heat generated by the electronic components 12 to the cooling member 19, which in turn releases the heat to the outside. In addition, the insulation layer 17, covering the terminals 13 of the electronic components 12 and the electric circuits 14, prevents unintended electrical communication between these components, which would otherwise take place due to the presence of the thermally conductive layer 18.

Advantages of the foregoing embodiment will now be described.

In the embodiment, the insulation layer 17 covering the terminals 13 of the electronic components 12 and the electric circuits 14 ensures electrical insulation for these components regardless of whether the thermally conductive layer 18 has a sufficient insulating property. Further, each of the electronic components 12 has its top surface substantially entirely covered with the thermally conductive layer 18 to give a large heat-conducting area. In this manner, the heat generated by the electronic components 12 is effectively conducted to the cooling member 19 through the thermally conductive layer 18.

The insulation layer 17, which further contains the highly thermally conductive filler with a high electrical resistance, not only improves the electrical insulation of the terminals 13 of the electronic components 12 and the electric circuits 14 but also enhances the heat conductivity of the entire sheet.

The thermally conductive sheet 15 has a simple construction in which the insulation layer 17 is selectively formed over part of the surface of the thermally conductive layer 18. Such a simple construction permits effective conduction of the heat generated by the electronic component 12 to the cooling member 19 while ensuring the electrical insulation of the terminals 13 of the electronic components 12 and the electric circuits 14.

The thermally conductive sheet 15 of the present invention, which includes the insulation layer 17 formed over the area that comes into contact with electrically conductive components, can eliminate electrical problems even when the thermally conductive sheet 15 contains effective amounts of graphitized carbon or metal powder, which, despite their high heat conductivity, are considered to be unsuitable for use as the thermally conductive filler due to their small electrical resistance. Moreover, the insulation layer 17, disposed to cover selected areas of the thermally conductive sheet 15 rather than the entire surface of the thermally conductive sheet 15, does not lower the heat conductivity, thus obtaining the high-performance of the thermally conductive sheet 15.

As a result, such structure allows the thermally conductive sheet 15 to eliminate electrical problems even when the thermally conductive filler of the thermally conductive sheet 15 contains effective amounts of graphitized carbon or metal powders. Accordingly, a thermally conductive sheet 15 is provided having a significantly higher heat conductivity than the existing thermally conductive sheets The above-described embodiment of the present invention will now be described in further detail with reference to examples and comparative examples, which are intended to be only illustrative and do not limit the scope of the invention in any way.

EXAMPLE 1

60% by volume of an addition reaction type liquid silicone gel (WACKER ASAHI KASEI SILICONE Co., Ltd.) having a specific gravity of 1.0 as the matrix was mixed with 20% by volume of graphitized carbon fiber having an average fiber length of 15 μm and 20% by volume of an alumina powder having an average particle size of 2 μm, each serving as the thermally conductive filler. The mixture was mixed in a mixer until the mixture was uniform and the uniform mixture was deaerated in vacuum. The mixture was then filled into a hollow aluminum die having a sheet-shaped cavity with 0.5 mm clearance and coated with a fluorine resin (polytetrafluoroethylene), and the mixture in the die was heat-cured in a magnetic field directed across the clearance of the cavity (i.e. along the thickness of a layer to be formed) to obtain a thermally conductive layer 18. The graphitized carbon contained in the resultant thermally conductive layer 18 was oriented along the thickness of the thermally conductive layer 18. The thermally conductive layer 18 had a heat conductivity of 6.8 W/m·K and an electrical resistance of 8 Ω·cm as measured along the thickness of the layer.

Then, a 0.05 mm thick fluorine resin sheet having an electrical resistance of $1.0 \times 10^{12}$ Ω·cm or higher was prepared, and as shown in FIG. 2(a), the parts of the sheet corresponding to the electronic components 12 were cut out from the sheet to form a plurality of windows 16. The fluorine resin sheet was then laminated onto the thermally conductive layer 18 to form an insulation layer 17. This completed a thermally conductive sheet 15.

EXAMPLE 2

A 0.5 mm thick thermally conductive layer 18 was formed in the same manner as in Example 1. As shown in FIG. 2(b), the parts of the thermally conductive layer 18 corresponding to the electronic components 12 were masked in conventional manner. Using the screen printing technique, a silicone ink having an electrical resistance of $1.0 \times 10^{12}$ Ω·cm or higher was applied over the masked layer to a thickness of 0.01 mm and was completely dried to form an insulation layer 17. This completed a thermally conductive sheet 15.

EXAMPLE 3

A 0.5 mm thick thermally conductive layer 18 was formed in the same manner as in Example 1.

Then, a polyester film to which a silicone adhesive with an electrical resistance of $1.0 \times 10^{12}$ Ω·cm had been applied to a thickness of 0.2 mm was prepared, and as shown in FIG. 2(a), the areas of the sheet corresponding to the electronic components 12 were cut out from the film to form a plurality of windows 16. The silicone adhesive-coated polyester film was then laminated onto the thermally conductive layer 18 to form an insulation layer 17. This completed a thermally conductive sheet 15.

Comparative Example 1

An additional reaction type liquid silicone gel (WACKER ASAHI KASEI SILICONE Co., Ltd.) having a specific gravity of 1.0 as the matrix was mixed with 20% by volume of graphitized carbon fiber having an average fiber length of 15 μm and 20% by volume of an alumina powder having an average particle size of 2 μm, each serving as the thermally conductive filler. The mixture was mixed in a mixer until the mixture was uniform and the uniform mixture was deaerated in vacuum. The mixture was then filled into a hollow aluminum die having a sheet-shaped cavity with 0.5 mm clearance and coated with a fluorine resin, and the mixture in the die was heat-cured in a magnetic field directed across the clearance of the cavity (i.e. along thickness of a layer to be formed) to obtain a thermally conductive layer 18. The graphitized carbon contained in the resultant thermally conductive layer 18 was oriented along the thickness of the thermally conductive layer 18. The thermally conductive layer 18 had a heat conductivity of 6.8 W/m·K and an electrical resistance of 8 Ω·cm as measured along the thickness of the layer.

Then, a 0.005 mm thick fluorine resin sheet having an electrical resistance of $1.0 \times 10^{12}$ Ω·cm or higher was prepared, and as shown in FIG. 2(a), the parts of the sheet corresponding to the electronic components 12 were cut out from the sheet to form a plurality of windows 16. The fluorine resin sheet was then laminated onto the thermally conductive layer 18 to form an insulation layer 17. This completed a thermally conductive sheet 15.

Comparative Example 2

A similar thermally conductive layer 18 was formed in the same manner as in Comparative Example 1. An insulation layer 17 was deposited on the parts of the thermally conductive layer 18 that correspond to the terminals 13 of the electronic components 12 and the electric circuits 14 to complete a thermally conductive sheet 15. The insulation layer 17 was formed by applying a liquid silicone ink with an electrical resistance of $1.0 \times 10^{12}$ Ω·cm or higher to a thickness of 1.2 mm using the metal printing technique and allowing the ink to harden.

Each of the thermally conductive sheets 15 of Examples 1 to 3 and Comparative Examples 1 and 2 was compressed by 10% along the thickness of the sheet, and the heat conductivity of the each sheet was measured in the same direction. Also, a load of 1N was applied to each thermally conductive sheet 15 and the electrical resistance of the insulation layer of each thermally conductive sheet 15 was measured along the thickness of the sheet. The results are shown in Tables 1 and 2.

TABLE 1

|  | Example 1 | Example 2 | Example 3 |
|---|---|---|---|
| Heat conductivity (W/m · K) | 6.7 | 6.8 | 6.3 |
| Electrical resistance (Ω · cm) | $10^{12}$ or higher | $10^{10}$ | $10^{12}$ or higher |

TABLE 2

|  | Comparative Example 1 | Comparative Example 2 |
|---|---|---|
| Heat conductivity (W/m · K) | 6.7 | 4.2 |
| Electrical resistance (Ω · cm) | $10^{12}$ or higher (8 in a defective part) | $10^{12}$ |

As can be seen from Table 1, the heat conductivity was sufficiently high for each of the thermally conductive sheets of Examples 1 to 3, while the electrical resistance of each insulation layer 17 was also excellent.

In comparison, the thin fluorine resin sheet of the thermally conductive sheet 15 of Comparative Example 1 did not impart sufficient rigidity to the insulation film 17. As a result, the insulation layer 17 was distorted, as shown in FIG. 4, resulting in a defective area 20 where the electric circuit 14 directly came into contact with the thermally conductive layer 18 without the insulation layer 17 between them. The electrical resistance in the defective area 20 was 8 Ω·cm. Thus, the insulation layer 17 that is too thin can result in the defective area where the thermally conductive layer 18 is exposed due to non-uniformity and distortion of the insulation layer 17. Despite its high heat conductivity, such a defective area has a low electrical resistance and may lead to problems when it comes into contact into with electrically conductive components.

In comparison, the thick insulation layer 17 of the thermally conductive sheet 15 of Comparative Example 2 makes it difficult to transform the thermally conductive layer 18 so that the thermally conductive layer conforms to the surface of the insulation layer 17. As a result, a gap 21 is formed between the electronic component 12 and the thermally conductive sheet 15 around the insulation layer 17. This led to insufficient contact of the thermally conductive sheet 15 with the electronic component 12 and thus to a reduced heat conductivity of the entire thermally conductive sheet 15 of 4.2 W/m·k. Accordingly, the insulation layer 17 that is excessively thick can result in a reduced contact area between the thermally conductive layer 18 and the electronic component 12, leading to a reduced heat conductivity of the entire thermally conductive sheet 15.

It should be apparent to those skilled in the art that the present invention may be embodied in many other specific forms without departing from the spirit or scope of the invention. Particularly, it should be understood that the invention may be embodied in the following forms.

When a number of the electronic components 12 are present, a plurality of the thermally conductive sheets 15 may be prepared depending on the amount of the heat emitted by each electronic component 12 or other factors, so that the electronic components 12 can be divided into different parts, each of which is covered by a different thermally conductive sheet 15.

The thermally conductive layer 18 and the insulation layer 17 of the thermally conductive sheet 15 may be prepared individually. The insulation layer 17 is first applied to each of the terminals 13 of the electronic components 12 and the electric circuits 14, for example, by using adhesive, and the thermally conductive layer 18 is subsequently applied over the electronic components 12 and the applied insulation layer 17.

A first thermally conductive sheet(s) is formed solely from the thermally conductive layer 18 to conform to the shape of each electronic component 12, and a second thermally conductive sheet(s) is formed from the insulation layer 17 and the thermally conductive layer 18 to conform to the shapes of the terminals 13 and the electric circuits 14. The first thermally conductive sheets and the second thermally conductive sheets are separately applied to the respective components.

Therefore, the present examples and embodiments are to be considered as illustrative and not restrictive and the invention is not to be limited to the details given herein, but may be modified within the scope and equivalence of the appended claims.

The invention claimed is:

1. A thermally conductive sheet for cooling an electronic component having a terminal and a top surface and being mounted on a substrate with an electric circuit, wherein the terminal of the electronic component electrically connects the electronic component to the electric circuit, said thermally conductive sheet comprising:
    a thermally conductive layer including matrix and thermally conductive filler contained in the matrix, wherein the thermally conductive layer has a first portion and a second portion; and
    an insulation layer disposed at the first portion of the thermally conductive layer so as to allow the second portion of the thermally conductive layer to be uncovered by the insulation layer, wherein, when the thermally conductive sheet is placed on the substrate and the electronic component, the insulation layer interposes between the first portion of the thermally conductive layer and the terminal of the electronic component and the electric circuit of the substrate to prevent the terminal and the electric circuit from contacting the first portion of the thermally conductive layer, while the second portion of the thermally conductive layer contacts substantially the entire area of the top surface of the electronic component for dissipating heat generated by the electronic component.

2. The thermally conductive sheet according to claim 1, wherein the insulation layer contains thermally conductive filler having an insulating property.

3. The thermally conductive sheet according to claim 1, wherein the matrix is made from at least one of liquid silicone rubber and liquid silicone gel.

4. The thermally conductive sheet according to claim 1, wherein the thermally conductive filler contained in the thermally conductive layer comprises one selected from the group consisting of carbon, a metal, and a combination thereof, and is provided in the form selected from the group consisting of powder, fibers, and a combination thereof.

5. The thermally conductive sheet according to claim 1, wherein the insulation layer has a thickness in the range of 0.01 to 1.0 mm.

6. A device for cooling an electronic component integrated in an electronic instrument, the electronic component having a terminal and a top surface and being mounted on a substrate with an electric circuit, wherein the terminal of the electronic component electrically connects the electronic component to the electric circuit the device comprising:
- a thermally conductive sheet including,
  - a thermally conductive layer including matrix and thermally conductive filler contained in the matrix, wherein the thermally conductive layer has a first side and a second sides, and wherein the first side includes a first portion and a second portion; and
  - an insulation layer disposed at the first portion of the thermally conductive layer so as to allow the second portion of the thermally conductive layer to be uncovered by the insulation layer; and
- a cooling member arranged on the second side of the thermally conductive layer,
  - wherein, when the device is placed on the substrate and the electronic component, the insulation layer interposes between the first portion of the thermally conductive layer and the terminal of the electronic component and the electric circuit of the substrate to prevent the terminal and the electric circuit from contacting the first portion of the thermally conductive layer, while the second portion of the thermally conductive layer contacts substantially the entire area of the top surface of the electronic component for conducting heat generated by the electronic component to the cooling member for dissipating the heat.

7. The device according to claim 6, wherein the insulation layer contains thermally conductive filler having an insulating property.

8. The device according to claim 6, wherein the matrix is made from one of liquid silicone rubber and liquid silicone gel.

9. The device according to claim 6, wherein the thermally conductive filler contained in the thermally conductive layer comprises one selected from the group consisting of carbon, a metal, and a combination thereof, and is provided in the form selected from the group consisting of powder, fibers, and a combination thereof.

10. The device according to claim 6, wherein the insulation layer has a thickness in the range of 0.01 to 1.0 mm.

11. The thermally conductive sheet according to claim 1, wherein the insulation layer has an electrical resistance of $1.0 \times 10^{10}$ Ω·cm or higher.

12. The thermally conductive sheet according to claim 1, wherein the thermally conductive layer has a thermal conductivity of 6.3 W/m·K or more.

13. The thermally conductive sheet according to claim 4, wherein the thermally conductive filler is selected from graphitized carbon, carbon black, graphite, gold, silver, copper, iron, zinc, nickel, aluminum, stainless steel, and composites thereof.

14. The device according to claim 6, wherein the insulation layer has an electrical resistance of $1.0 \times 10^{10}$ Ω·cm or higher.

15. The device according to claim 6, wherein the thermally conductive layer has a thermal conductivity of 6.3 W/m·K or more.

16. The device according to claim 9, wherein the thermally conductive filler is selected from graphitized carbon, carbon black, graphite, gold, silver, copper, iron, zinc, nickel, aluminum, stainless steel, and composites thereof.

17. A thermally conductive sheet for cooling an electronic component having a terminal and a top surface and being mounted on a substrate with an electric circuit, wherein the terminal of the electronic component electrically connects the electronic component to the electric circuit, said thermally conductive sheet comprising:
- a thermally conductive layer including matrix and thermally conductive filler contained in the matrix; and
- an insulation layer disposed at the thermally conductive layer, wherein the insulation layer includes a through window having a size and a shape substantially the same as that of the top surface of the electronic component for receiving the electronic component therein when the thermally conductive sheet is placed on the substrate and the electronic component, thereby the insulation layer interposes between the thermally conductive layer and the terminal of the electronic component and the electric circuit of the substrate so as to contact to the terminal and the electric circuit for preventing the terminal and the electric circuit from contacting with the thermally conductive layer, and a portion of the thermally conductive layer contacts substantially the entire area of the top surface of the electronic component through the through window for dissipatine heat generated by the electronic comnonent.

18. The thermally conductive sheet according to claim 1, wherein the terminal laterally extends from the electronic component.

19. The device according to claim 6, wherein the terminal laterally extends from the electronic component.

20. The thermally conductive sheet according to claim 17, wherein the terminal laterally extends from the electronic component.

* * * * *